(12) United States Patent
Strelkova et al.

(10) Patent No.: US 7,434,198 B2
(45) Date of Patent: Oct. 7, 2008

(54) METHOD AND COMPUTER PROGRAM PRODUCT FOR DETECTING POTENTIAL FAILURES IN AN INTEGRATED CIRCUIT DESIGN AFTER OPTICAL PROXIMITY CORRECTION

(75) Inventors: Nadya Strelkova, Portland, OR (US); Santosh Menon, Troutdale, OR (US)

(73) Assignee: LSI Logic Corporation, Milpitas, CA (US)

( * ) Notice: Subject to any disclaimer, the term of this patent is extended or adjusted under 35 U.S.C. 154(b) by 247 days.

(21) Appl. No.: 11/323,401

(22) Filed: Dec. 29, 2005

(65) Prior Publication Data
US 2007/0157152 A1 Jul. 5, 2007

(51) Int. Cl.
G06F 17/50 (2006.01)

(52) U.S. Cl. .............................. 716/19; 716/11; 716/12; 716/21

(58) Field of Classification Search ..................... 716/1, 716/11, 12, 19, 21
See application file for complete search history.

(56) References Cited

U.S. PATENT DOCUMENTS

| 5,879,844 A | * | 3/1999 | Yamamoto et al. ............ 430/30 |
| 2005/0132306 A1 | * | 6/2005 | Smith et al. .................... 716/1 |

* cited by examiner

*Primary Examiner*—Thuan Do
(74) *Attorney, Agent, or Firm*—Eric James Whitesell

(57) ABSTRACT

A method of detecting potential failures from a corrected mask design for an integrated circuit includes steps of receiving as input a corrected mask design for an integrated circuit, searching the corrected mask design to find a critical edge of a polygon that is closer than a selected minimum distance from a polygon edge opposite the critical edge, constructing a critical region bounded by the critical edge and the polygon edge opposite the critical edge, comparing the critical region to a potential defect criterion, and generating as output a location of the critical region when the critical region satisfies the potential defect criterion.

16 Claims, 8 Drawing Sheets

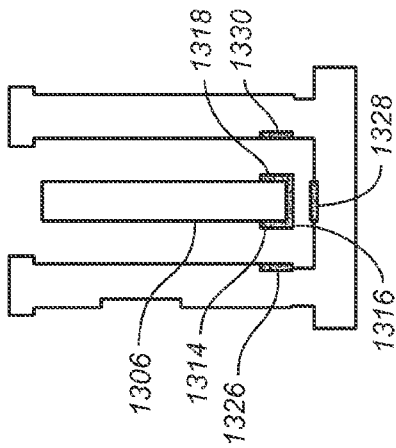
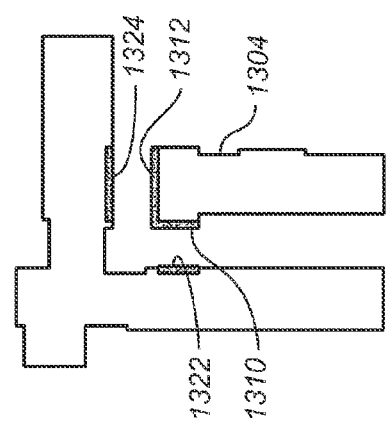
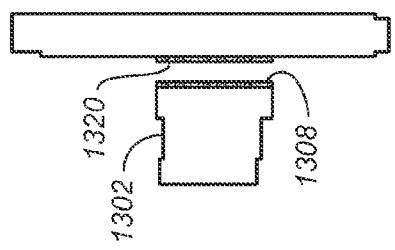
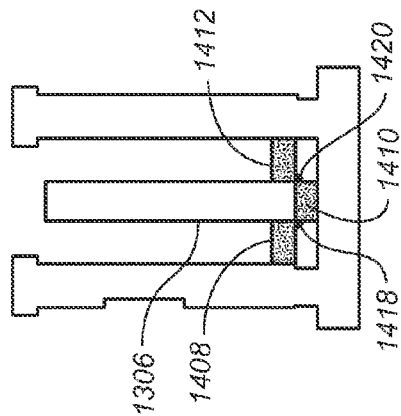
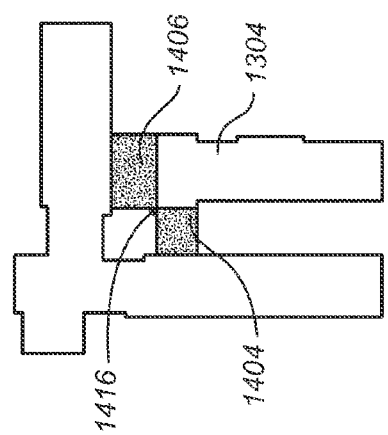
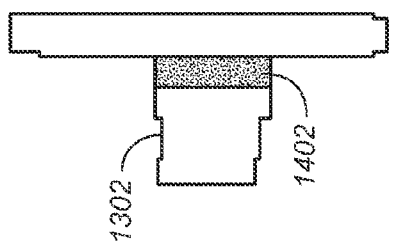

US 7,434,198 B2

METHOD AND COMPUTER PROGRAM PRODUCT FOR DETECTING POTENTIAL FAILURES IN AN INTEGRATED CIRCUIT DESIGN AFTER OPTICAL PROXIMITY CORRECTION

BACKGROUND OF THE INVENTION

1. Field of the Invention

The present invention is directed to the manufacture of integrated circuit packages. More specifically, but without limitation thereto, the present invention is directed to optical proximity correction procedures for integrated circuit designs.

2. Description of the Prior Art

Optical Proximity Correction (OPC) is a step in the manufacturing process that semiconductor manufacturers employ to improve the quality of high-performance integrated circuit designs and to extend the lifetime of photolithography equipment. The overall lithography process involves projecting a circuit design from a mask through a complex lens system that forms the image of an integrated circuit design onto a wafer that will later be divided into individual chips. The resulting image of one of the masking layers, including metal layers and polysilicon layers, is used to construct the integrated circuit. The image contains critical dimensions that include line widths and spacing between adjacent features that may be smaller than the wavelength of the light used to image the mask on the wafer.

SUMMARY OF THE INVENTION

In one embodiment, a method of detecting potential failures in an integrated circuit design includes steps of:
 (a) receiving as input an optical proximity corrected mask design for an integrated circuit;
 (b) searching the corrected mask design to find a critical edge of a polygon that is closer than a selected minimum distance from a polygon edge opposite the critical edge;
 (c) constructing a critical region bounded by the critical edge and the polygon edge opposite the critical edge;
 (d) comparing the critical region to a potential defect criterion; and
 (e) generating as output a location of the critical region when the critical region satisfies the potential defect criterion.

In another embodiment, a computer program product includes:
 a medium for embodying a computer program for input to a computer; and
 a computer program embodied in the medium for causing the computer to perform steps of:
 (a) receiving as input an optical proximity corrected mask design for an integrated circuit;
 (b) searching the corrected mask design to find a critical edge of a polygon that is closer than a selected minimum distance from a polygon edge opposite the critical edge;
 (c) constructing a critical region bounded by the critical edge and the polygon edge opposite the critical edge;
 (d) comparing the critical region to a potential defect criterion; and
 (e) generating as output a location of the critical region when the critical region satisfies the potential defect criterion.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIGS. 13A, 13B and 13C illustrate critical edges found in a mask design of an integrated circuit after optical proximity correction;

FIGS. 14A, 14B and 14C illustrate examples of critical regions constructed from the critical edges in FIGS. 13A, 13B and 13C;

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Several problems arise from the small size of patterns of a mask projected onto a wafer to form an integrated circuit during photolithography due to the inherent limitations of the imaging system. For example, the high frequency components required to reproduce the sharp edges in polygon features may fall outside the wavelength range of the projection lens. Also, light used to form one feature may stray into another feature in close proximity, leading to a complex interaction of electric fields of adjacent openings of a mask. The final images of polygon shapes have rounded corners and may bulge towards adjacent shapes, possibly shorting together or bridging, which may result in a chip defect.

Optical proximity correction (OPC) is a process that modifies the polygons drawn by the mask designers to compensate for the non-ideal properties of the lithography process. Given the shapes desired on the wafer, the mask design is modified to improve the reproduction of the critical geometry on a wafer level. This is done by dividing polygon edges into small segments and moving the segments around, and by adding and removing small portions of polygons at strategic locations in the mask design. The addition of the optical proximity correction procedure to the mask design flow allows for smaller geometry designs to be manufactured with exposure systems having an exposure system wavelength that is almost twice the minimum feature dimension, significantly improving process reliability and yield.

Figure 1:
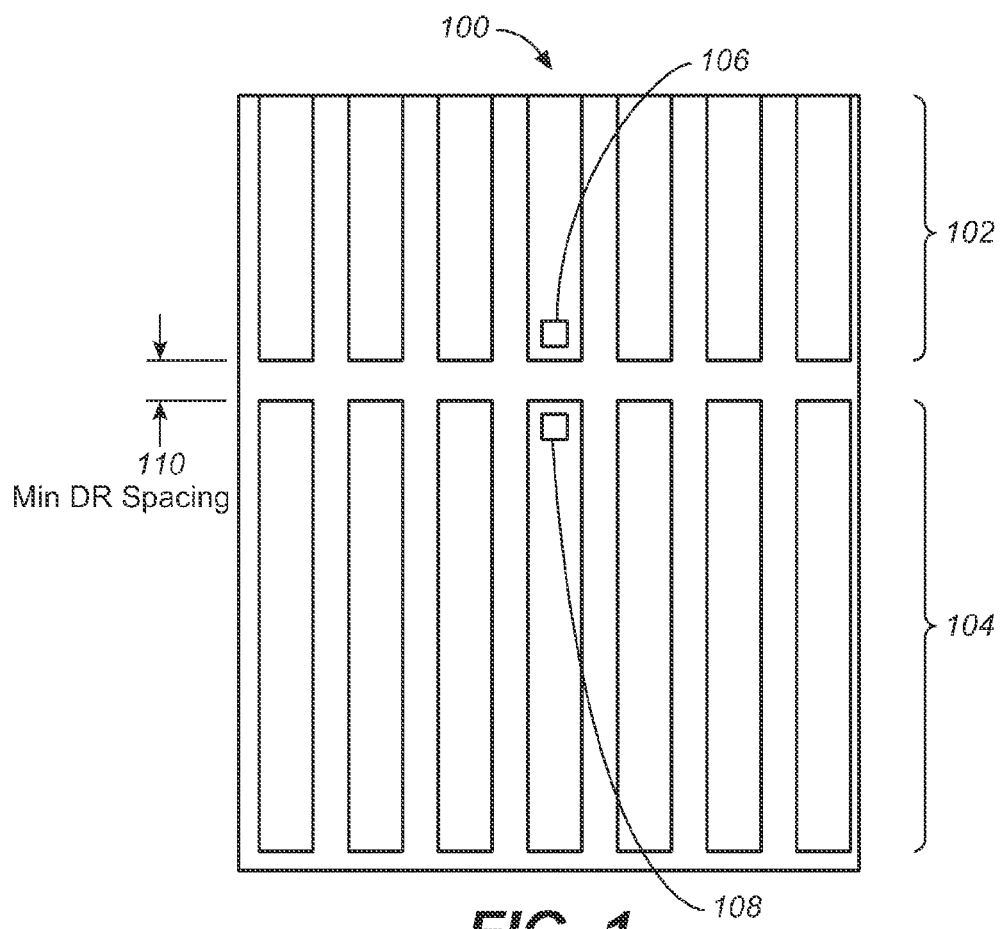
FIG. 1 illustrates a mask design before optical proximity correction according to the prior art.

FIG. 1 illustrates a mask design 100 before optical proximity correction according to the prior art. Shown in FIG. 1 are traces 102 and 104, ideal vias 106 and 108, and a minimum design rule spacing 110.

In FIG. 1, the traces 102 and 104 and the vias 106 represent the ideal shape of the vias and traces of an integrated circuit design that are to be formed on a wafer. The design rule spacing 110 between the ends of traces 102 and 104 is determined by the technology used to manufacture the integrated circuit.

Figure 2:
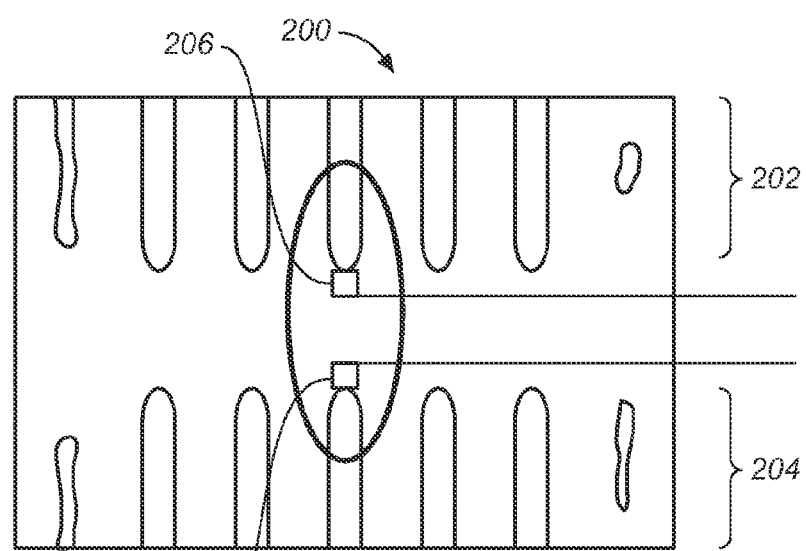
FIG. 2 illustrates an empirical image of the mask design of FIG. 1 projected onto a wafer according to the prior art.

FIG. 2 illustrates an empirical image 200 of the mask design of FIG. 1 projected onto a wafer according to the prior art. Shown in FIG. 2 are ideal vias 106 and 108 and images 202 and 204.

In FIG. 2, the line ends of the images 202 and 204 of the traces 102 and 104 are shorter and narrower than the ideal traces 102 and 104 in FIG. 1. Also, the ideal vias 106 and 108 do not coincide with the image of the mask 100, resulting in poorer connections between the two masking layers and possible failure of the integrated circuit.

To compensate for the distortions of the ideal polygons in the polygon images, an optical proximity correction procedure is usually employed. There are many optical proximity correction algorithms, generally classified as rule-based or model-based.

Model-based methods involve subdividing polygons into smaller shapes or edge segments (fragmentation) and moving, adding, or removing polygon fragments, performing a fast simulation to determine whether the corrected polygons produce an image closer to the ideal, and repeating the process until a satisfactory result is achieved. Rule-based optical proximity correction is simpler in that various geometries are treated by different rules without performing a simulation.

Managing a large geometry database in rule-based or model-based optical proximity correction is computationally intensive, and the simulations involved in model-based optical proximity correction are even more computationally intensive, because there is no closed form solution for the optimum layout.

Figure 3:
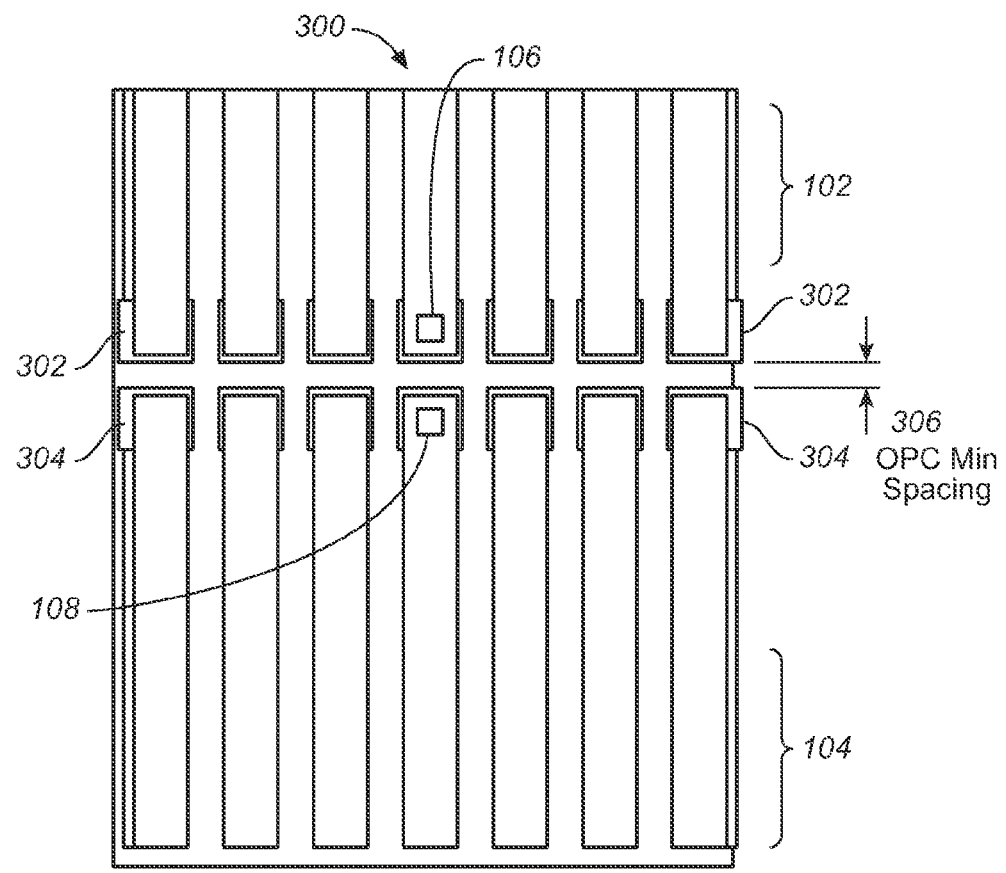
FIG. 3 illustrates a corrected mask design for the mask design of FIG. 1 after optical proximity correction according to the prior art.

FIG. 3 illustrates a corrected mask design 300 for the mask design of FIG. 1 after optical proximity correction according to the prior art. Shown in FIG. 3 are traces 102 and 104, ideal vias 106 and 108, added polygons 302 and 304, and a minimum optical proximity correction spacing 306.

In FIG. 3, the added polygons 302 and 304 increase the area of the line ends of the traces 102 and 104 to compensate for the line end pull-back resulting from projecting the image of the mask onto the wafer. The minimum optical proximity correction spacing 306 is a software-specific parameter that may be determined empirically by the type of projection beam used and other physical factors in the manufacturing process.

Figure 4:
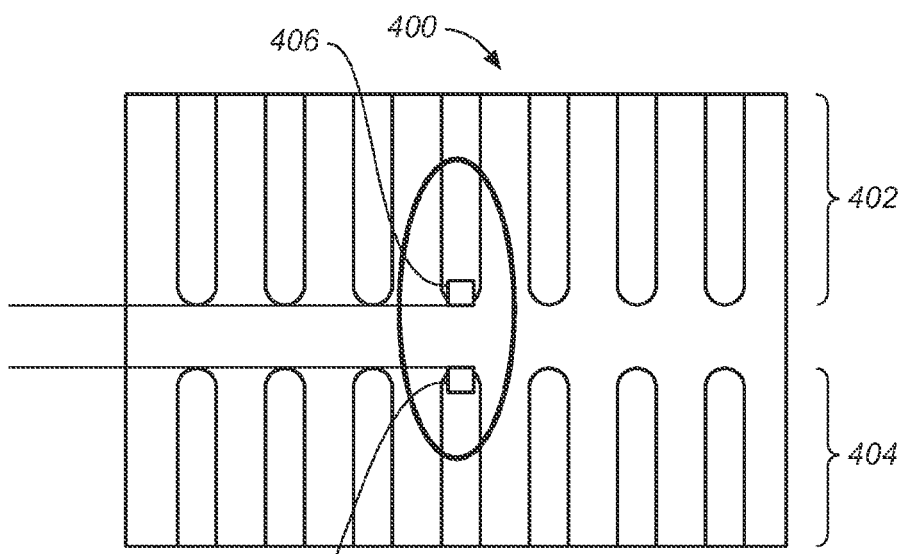
FIG. 4 illustrates an empirical image of the mask design of FIG. 3 projected onto a wafer according to the prior art.

FIG. 4 illustrates an empirical image 400 of the mask design of FIG. 3 projected onto a wafer according to the prior art. Shown in FIG. 4 are ideal vias 106 and 108 and trace images 402 and 404.

In FIG. 4, the ends of the trace images 402 and 404 are wider and longer than in FIG. 2, more closely resembling the ideal traces 102 and 104 in FIG. 1. The line ends of traces 102 and 104 in FIG. 1 enhanced by optical proximity correction ensure a via landing on the prior mask image that provides a robust connection between two masking layers of an integrated circuit. In general, the mask design used in the examples above is far more complex in a typical integrated circuit design and may include millions of polygons in a wide variety of shapes and sizes.

Figure 5:
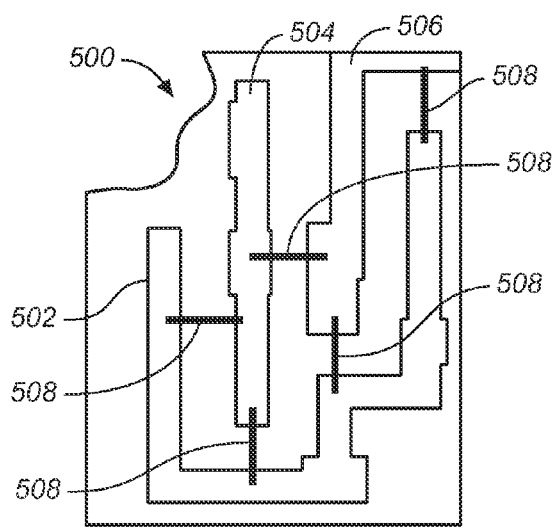
FIG. 5 illustrates a portion of an interconnect mask design of a typical interconnect circuit before optical correction according to the prior art.

FIG. 5 illustrates a portion of an interconnect mask design 500 of a typical interconnect circuit before optical correction according to the prior art. Shown in FIG. 5 are metal routing traces 502, 504 and 506, and trace spacing 508.

In FIG. 5, the trace spacing 508 separates the metal routing traces 502, 504 and 506 from one another.

Figure 6:
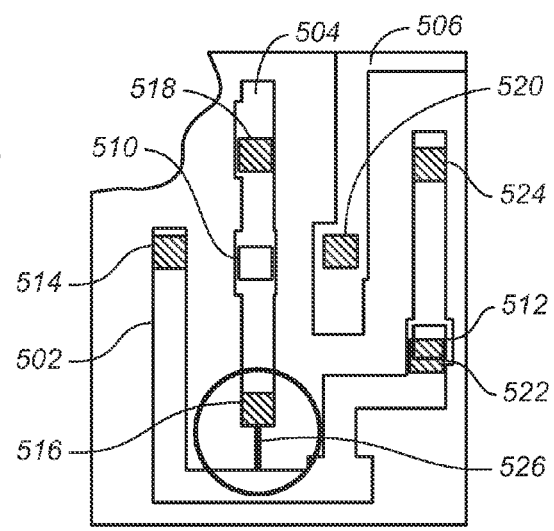
FIG. 6 illustrates the mask design of FIG. 5 interacting with a prior masking layer (integrated circuit contact) and a subsequent masking layer (integrated circuit via) according to the prior art.

FIG. 6 illustrates the mask design of FIG. 5 interacting with a prior masking layer (integrated circuit contact) and a subsequent masking layer (integrated circuit via) according to the prior art. Shown in FIG. 6 are metal routing traces 502, 504 and 506, contacts 510 and 512, vias 514, 516, 518, 520, 522 and 524, and a minimum design rule spacing 526.

In FIG. 6, the minimum design rule spacing 526 separates the two metal routing traces 502 and 504 and illustrates a critical site between the metal routing traces 502 and 504. The connection will fail if the images of the metal routing traces 502 and 504 merge on the wafer.

Figure 7:
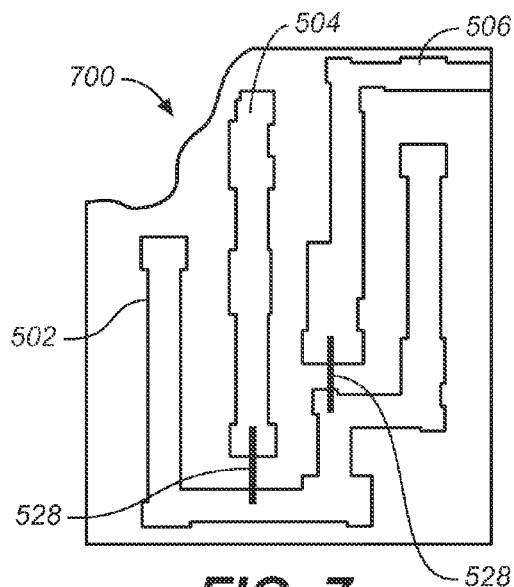
FIG. 7 illustrates a corrected mask design for the mask of FIG. 5 using a minimum optical proximity correction spacing according to the prior art.

FIG. 7 illustrates a corrected mask design 700 for the mask of FIG. 5 using a minimum optical proximity correction spacing according to the prior art. Shown in FIG. 7 are metal routing traces 502, 504 and 506, and a minimum optical proximity correction spacing 528.

In FIG. 7, an optical proximity correction of the mask design of FIG. 5 results in the minimum optical proximity correction spacing 528 between the metal routing traces 502 and 504 and between the metal routing traces 502 and 506.

Figure 8:
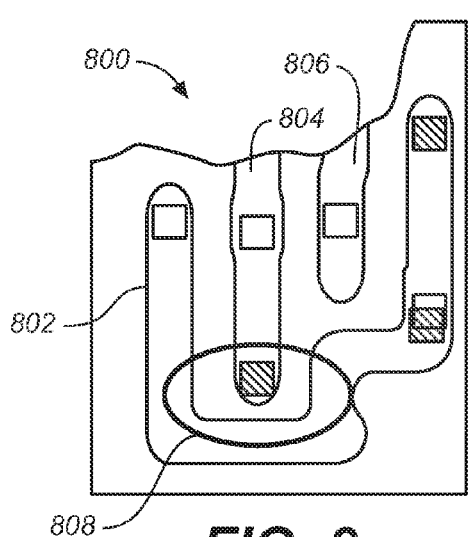
FIG. 8 illustrates a photograph taken by a scanning electron microscope of a bridging defect resulting from the corrected mask design of FIG. 7 according to the prior art.

FIG. 8 illustrates a photograph 800 taken by a scanning electron microscope of a bridging defect resulting from the corrected mask design of FIG. 7 according to the prior art. Shown in FIG. 8 are metal routing traces 802, 804 and 806, and a bridging defect 808.

In FIG. 8, the minimum optical proximity correction spacing 528 in FIG. 7 in the corrected mask design is not sufficient to avoid the bridging defect 808 between the metal routing traces 502 and 504.

Figure 9:
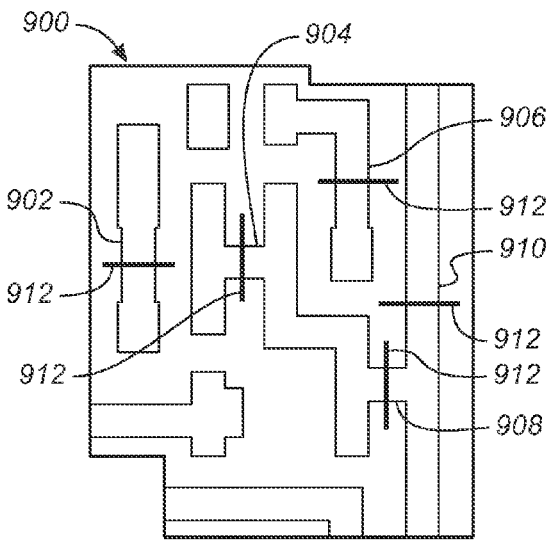
FIG. 9 illustrates a portion of an interconnect mask design of a typical interconnect circuit before optical correction according to the prior art.

FIG. 9 illustrates a portion of an interconnect mask design 900 of a typical interconnect circuit before optical correction according to the prior art. Shown in FIG. 9 are metal routing traces 902, 904, 906, 908 and 910, and trace width 912.

In FIG. 9, each of the metal routing traces 902, 904, 906, 908 and 910 has a corresponding trace width 912.

Figure 10:
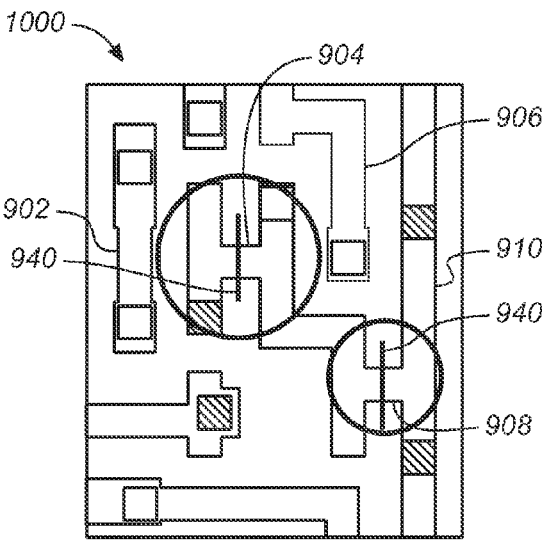
FIG. 10 illustrates the mask design of FIG. 9 interacting with a prior masking layer (integrated circuit contact) and a subsequent masking layer (integrated circuit via) according to the prior art.

FIG. 10 illustrates the mask design of FIG. 9 interacting with a prior masking layer (integrated circuit contact) and a subsequent masking layer (integrated circuit via) according to the prior art. Shown in FIG. 10 are metal routing traces 902, 904, 906, 908 and 910, and a minimum design rule width 940.

In FIG. 10, the minimum design rule width 940 illustrates a critical site between the metal routing traces 904 and 908. The inter/intra layer connection fails if the metal routing traces 904 and 908 break on the wafer (pinching defect).

Figure 11:
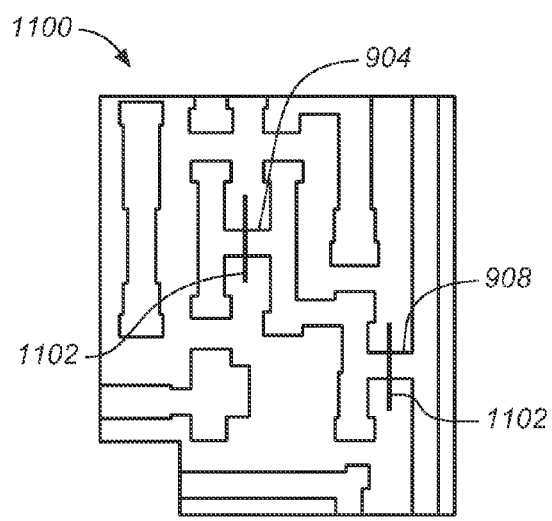
FIG. 11 illustrates a corrected mask design for the mask of FIG. 9 using a minimum optical proximity correction width according to the prior art.

FIG. 11 illustrates a corrected mask design 1100 for the mask of FIG. 9 using a minimum optical proximity correction width according to the prior art. Shown in FIG. 11 are metal routing traces 904 and 908 and a minimum optical proximity correction width 1102.

In FIG. 11, the optical proximity correction procedure has removed portions of the metal routing traces 904 and 908 to compensate for the image distortion of the metal routing traces 904 and 908.

Figure 12:
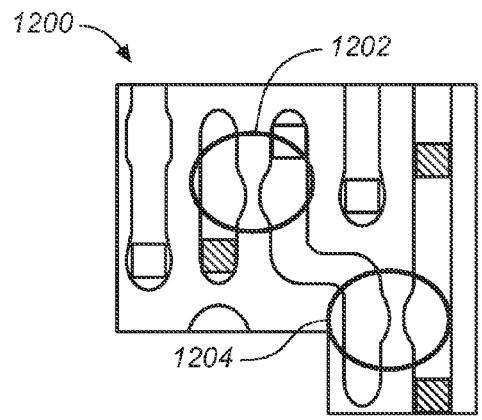
FIG. 12 illustrates a photograph taken by a scanning electron microscope of pinching defects resulting from the corrected mask design of FIG. 11 according to the prior art.

FIG. 12 illustrates a photograph 1200 taken by a scanning electron microscope of pinching defects resulting from the corrected mask design of FIG. 11 according to the prior art. Shown in FIG. 12 are images of metal routing traces 904 and 908 and pinching defects 1202 and 1204.

In FIG. 12, the minimum polygon width 1102 allowed for optical proximity correction is not sufficient to avoid the pinching defects 1202 and 1204 in the metal routing traces 904 and 908 in FIG. 11 that have the minimum optical proximity correction width 1102. As a result of the pinching defects 1202 and 1204, the metal routing traces 904 and 908 are narrowed to the point of becoming open circuits (breakdown). If the minimum polygon width allowed for optical proximity correction is too aggressive, then normal manufacturing process variations such as non-uniform wafer thickness and slight differences in projection beam focus and intensity may result in the pinching defects 1202 and 1204.

A disadvantage of the optical proximity correction algorithms described above is that they approximate experimental imaging data, and the approximation is not perfect. Consequently, optical rule checking algorithms have been developed that perform a full-chip simulation of the corrected mask design to check the performance of optical proximity correction algorithms. The optical rule checking software calculates the distance between the target design edge placement of the ideal mask design and the resulting image contour of the corrected mask design at pre-defined sites and reports those sites where the calculated distance exceeds a specified tolerance. Disadvantageously, the optical rule checking software is time consuming and requires a large amount of computer resources. Also, the sites reported by the optical rule checking software have to be individually simulated and visually inspected to determine whether a real problem exists, because in many cases, a reported site is not likely to result in a chip defect. In complex designs in which there may be millions of reported sites, investigating each reported site becomes impractical.

A method is described below for checking a corrected mask design so that only the sites that are most likely to result in a chip defect are screened for individual simulation and inspection. In many cases, the number of sites screened by this method is several orders of magnitude smaller than the number of sites reported by commercially available optical rule checking software. For example, the screening method described below may indicate only a dozen or so sites that require individual simulation and inspection. Also, the method for checking a corrected mask design described below does not require performing a full-chip simulation, resulting in reduced turnaround time and fewer required computer resources.

In one embodiment, a method of detecting potential failures in an integrated circuit design includes steps of:
(a) receiving as input an optical proximity corrected mask design for an integrated circuit;
(b) searching the corrected mask design to find a critical edge of a polygon that is closer than a selected minimum distance from a polygon edge opposite the critical edge;
(c) constructing a critical region bounded by the critical edge and the polygon edge opposite the critical edge;
(d) comparing the critical region to a potential defect criterion; and
(e) generating as output a location of the critical region when the critical region satisfies the potential defect criterion.

An optical proximity corrected mask design for an integrated circuit may be analyzed as follows to determine whether a defect is likely to occur in the integrated circuit die to be manufactured.

FIGS. 13A, 13B and 13C illustrate critical edges found in a mask design of an integrated circuit after optical proximity correction. Shown in FIGS. 13A, 13B and 13C are a long edge polygon 1302, a partially enclosed polygon 1304, an enclosed polygon 1306, critical edges 1308, 1310, 1312, 1314, 1316 and 1318, and opposite polygon edges 1320, 1322, 1324, 1326, 1328 and 1330.

In FIG. 13A, the long edge polygon 1302 is frequently called a hammerhead due to the extended sides added by the optical proximity correction program to compensate for the rounding at the corners. The critical edge 1308 extending from corner to corner at the line end of the long edge polygon 1302 faces the opposite polygon edge 1320. A critical edge length limit is defined, for example, by simulation and/or empirical validation of a mask design, as a polygon edge having a length at which bridging occurs between the polygon edge and an opposite polygon edge, where the critical edge and the opposite polygon edge are separated by the minimum spacing/width allowed by the optical proximity correction software. The term "spacing/width" is used herein to include both a spacing between opposite edges of adjacent polygons and a width between opposite edges of a single polygon. For example, when referring to adjacent conductors, the term "spacing/width" means the distance between opposite edges of the adjacent conductors, and when referring to a single conductor, the term "spacing/width" means the distance between opposite edges of a single conductor.

In FIG. 13B, the partially enclosed polygon 1304 has a line end and one side facing two edges of an opposite polygon. If the spacing between the line end of the partially enclosed polygon 1304 facing the adjacent polygon is less than a spacing limit selected from a range between the minimum design rule spacing and the minimum spacing allowed by the optical proximity correction software, then the critical edge 1312 is defined between the partially enclosed polygon 1304 and the opposite polygon. Likewise, if the spacing between the side of the partially enclosed polygon 1304 facing the adjacent polygon is less than the spacing limit, then the critical edge 1310 is defined between the partially enclosed polygon 1304 and the opposite polygon. The critical edges 1310 and 1312 extend from corner to corner of the partially enclosed polygon 1304 as shown in FIG. 13B.

In FIG. 13C, the enclosed polygon 1306 has a line end and two sides facing edges of an opposite polygon. The enclosed polygon 1306 generally occurs with much less frequency than the partially enclosed polygon 1304. If the spacing between the line end of the enclosed polygon 1306 facing the adjacent polygon is less than the spacing limit, then the critical edge 1316 is defined between the enclosed polygon 1306 and the adjacent polygon. Likewise, if the spacing between one side of the enclosed polygon 1306 facing the opposite polygon is less than the spacing limit, then the critical edge 1314 is defined between the enclosed polygon 1306 and the adjacent polygon, and if the spacing between the other side of the enclosed polygon 1306 facing the opposite polygon is less than the spacing limit, then the critical edge 1318 is defined between the enclosed polygon 1306 and the opposite polygon. The critical edges 1314, 1316 and 1318 each extend from corner to corner of the enclosed polygon 1306 as shown in FIG. 13C.

FIGS. 14A, 14B and 14C illustrate examples of critical regions constructed from the critical edges in FIGS. 13A, 13B and 13C. Shown in FIGS. 14A, 14B and 14C are a long edge polygon 1302, a partially enclosed polygon 1304, an enclosed polygon 1306, critical regions 1402, 1404, 1406, 1408, 1410 and 1412, and common points 1416, 1418 and 1420.

In FIG. 14A, the critical region 1402 is constructed from the critical edge 1308 in FIG. 13A by forming a rectangle bounded by the critical edge 1308 and the opposite edge 1320. The inventors have found that a high probability of a bridging defect exists if the critical region 1402 has an area that exceeds the product of the critical edge length limit times the minimum allowed spacing of the optical proximity correction procedure, then the critical region 1402 satisfies the criterion for a potential defect.

In FIG. 14B, the critical region 1404 is constructed from the critical edge 1310 in FIG. 13B by forming a rectangle bounded by the critical edge 1310 and the opposite edge 1322. The critical region 1406 is constructed from the critical edge 1312 in FIG. 13B by forming a rectangle bounded by the critical edge 1312 and the opposite edge 1324. The critical regions 1404 and 1406 share the common point 1416. The inventors have found that a high probability of a bridging defect exists in the vicinity of the common point 1416. Consequently, the location of the common point 1416 is reported as the center of a site of a likely defect that may be visually inspected from a simulation of the mask image at the location of the common point 1416.

In FIG. 14C, the critical region 1408 is constructed from the critical edge 1314 in FIG. 13C by forming a rectangle bounded by the critical edge 1314 and the opposite edge 1326. The critical region 1410 is constructed from the critical edge 1316 in FIG. 13C by forming a rectangle bounded by the critical edge 1316 and the opposite edge 1328. The critical region 1412 is constructed from the critical edge 1316 in FIG. 13C by forming a rectangle bounded by the critical edge 1318 and the opposite edge 1330. The critical regions 1408, 1410 and 1412 share the common points 1418 and 1420. Consequently, the locations of the points 1418 and 1420 are reported as the centers of a site of a likely defect that may be visually inspected from a simulation of the mask image at the locations of the points 1418 and 1420.

Figure 15:
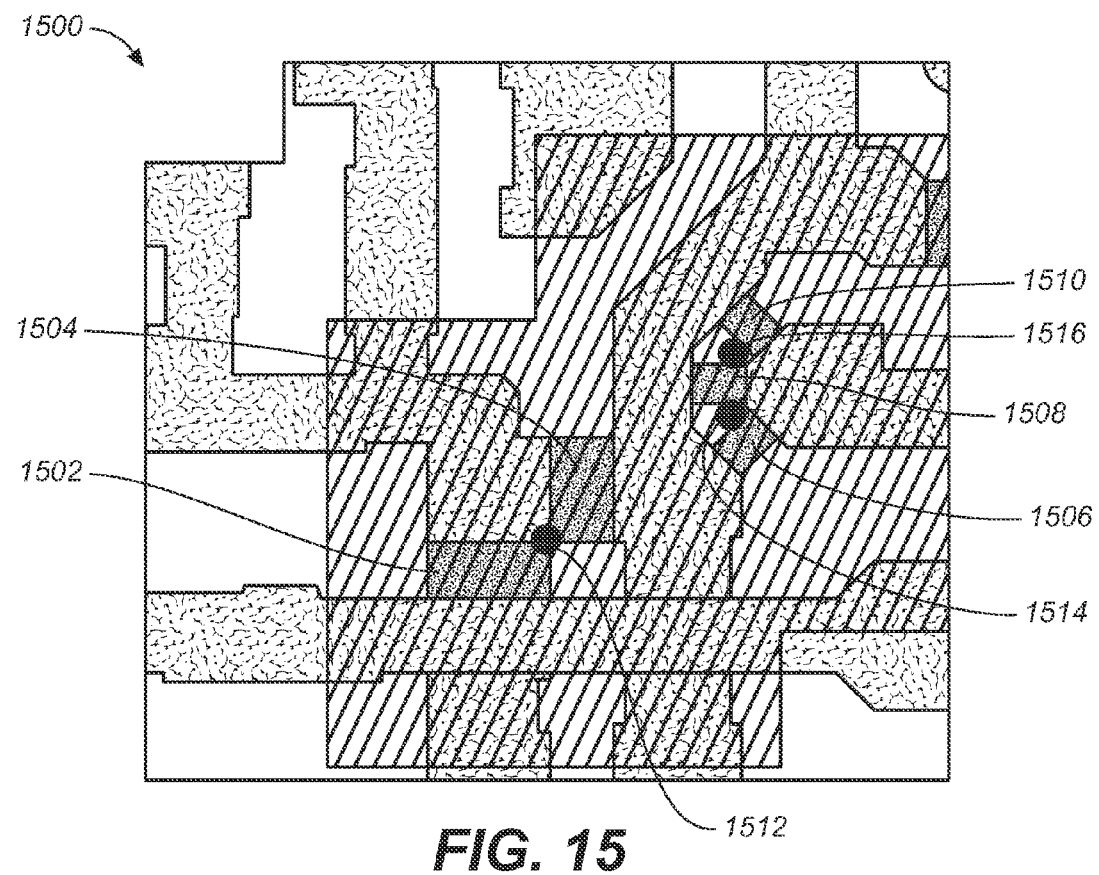
FIG. 15 illustrates a corrected mask design for a known defective die including critical regions that share a common point.

FIG. 15 illustrates a corrected mask design 1500 for a known defective die including critical regions that share a common point. Shown in are critical regions 1502, 1504, 1506, 1508 and 1510, and common points 1512, 1514 and 1516.

In FIG. 15, a manufactured die was known to be defective from failed testing; however, the location of the defect was not apparent from the test that failed. An analysis of the corrected mask design 1500 used to manufacture the die found 28 critical regions, including the critical regions 1502, 1504, 1506, 1508 and 1510 from which the common points 1512, 1514 and 1516 were identified. When the locations of the common points 1512, 1514 and 1516 were inspected at the fabrication laboratory with a scanning electron microscope, a bridging defect was found.

Figure 16:
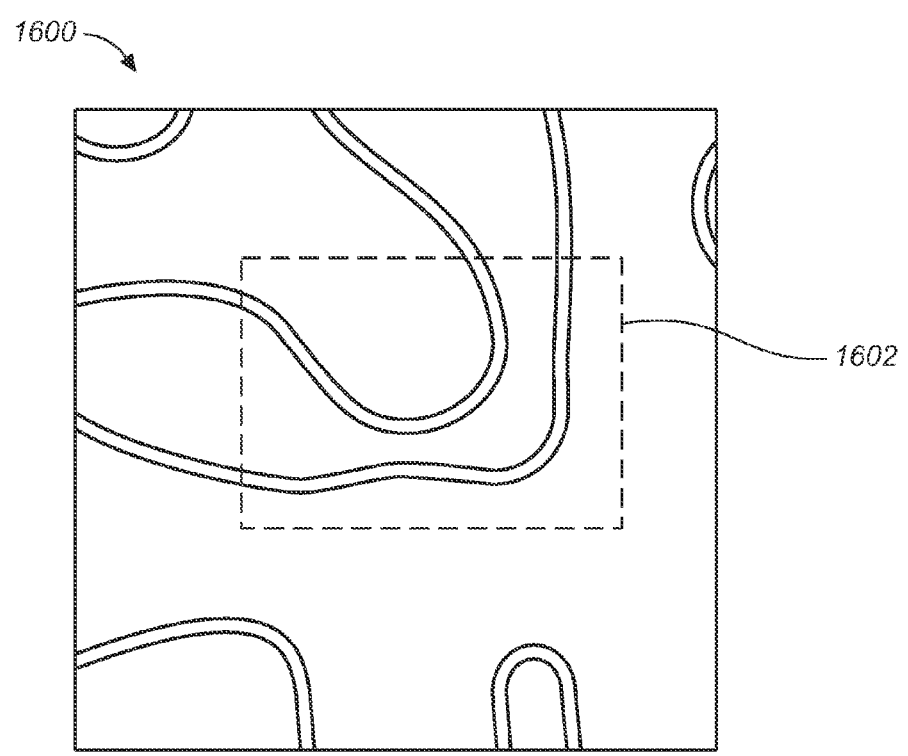
FIG. 16 illustrates a photograph taken by a scanning electron microscope of a bridging defect at one of the touching critical regions in FIG. 15.

FIG. 16 illustrates a photograph 1600 taken by a scanning electron microscope of a bridging defect at one of the touching critical regions in FIG. 15. Shown in FIG. 16 is a bridging defect 1602.

In FIG. 16, the bridging defect 1602 was found at the location of the common point 1512 in FIG. 15 out of only 28 possible defect locations found by constructing the critical regions described above, in contrast to the millions of possible defect locations that are typically reported by previous optical rule checking methods.

Figure 17:
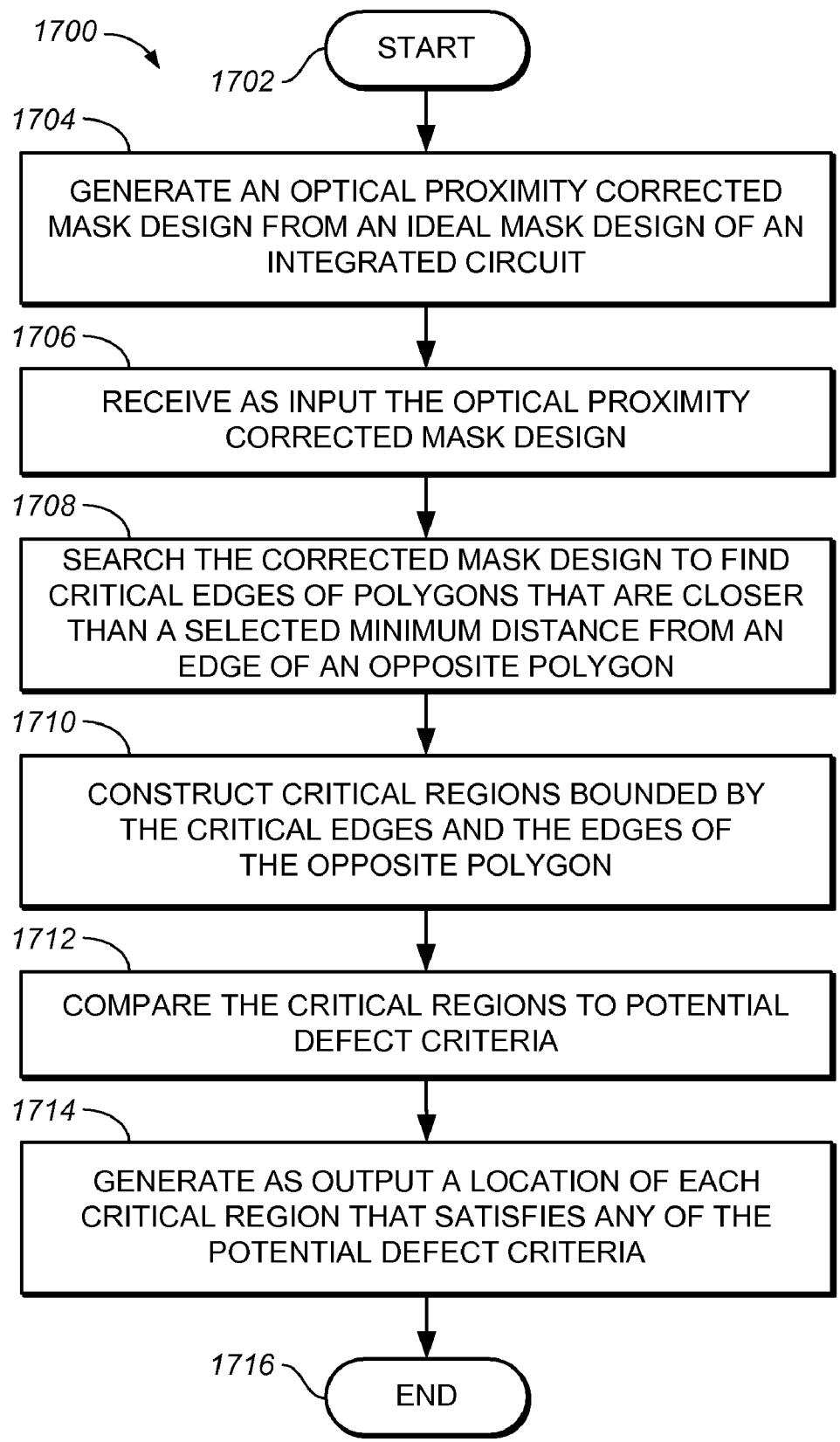
FIG. 17 illustrates a flow chart for a method of detecting potential defects in a mask design of an integrated circuit after optical proximity correction.

FIG. 17 illustrates a flow chart 1700 for a method of detecting potential defects in a mask design of an integrated circuit after optical proximity correction.

Step 1702 is the entry point for the flow chart 1700.

In step 1704, an optical proximity corrected mask design is generated from an ideal mask design of an integrated circuit, for example, by an optical proximity correction program according to well-known techniques.

In step 1706, the corrected mask design received as input.

In step 1708, the corrected mask design is searched to find critical edges at the ends of polygons that are closer than a selected minimum distance from a polygon edge opposite the critical edge as described with reference to FIGS. 13A, 13B and 13C. Examples of polygons that may include critical edges are a long edge polygon, a partially enclosed polygon, and an enclosed polygon. The corrected mask design search may be searched, for example, by commercially available software using the following commands:

EXTERNAL Metal{SPACING < 1.25*OPC_Min}TEMP= S_less_1p25OPCMin
EXTERNAL Metal{SPACING < OPC_Min}TEMP=S_less_OPCMin The search finds the critical edges illustrated in the examples of FIGS. 13A, 13B and 13C from which the rectangular critical regions illustrated in FIGS. 14A, 14B and 14C are constructed.

In one embodiment, the selected minimum spacing is 1.25 times the minimum spacing allowed by the optical proximity correction procedure (a critical bin). In other embodiments, the selected minimum spacing OPCMin has a value in the range between the design rule spacing and 1.25 times the minimum spacing allowed by the optical proximity correction procedure (a moderately critical bin). In general, the number of sites reported depends on the selected minimum spacing, with larger values of minimum spacing resulting in more reported sites for inspection.

In step 1710, critical regions are constructed from the critical edges as described with reference to FIGS. 14A, 14B and 14C. In one embodiment, the critical regions are rectangles bounded by the critical edge and the edge of the opposite polygon.

In step 1712, the critical regions are compared to criteria that define a potential defect. Examples of potential defect criteria include a critical region having an area that exceeds the product of the critical edge length limit times the minimum allowed spacing/width of the optical proximity correction procedure as illustrated in FIG. 14A and a critical region that shares a common point with another critical region as illustrated in FIGS. 14B and 14C. Another example of a potential defect criterion includes a critical region that has a corner that is less than a selected distance, for example, 0.1 times the optical proximity correction minimum spacing/width, from a corner of another critical region, that is, the corner-to-corner distance is less than or equal to 0.1★OPC-Min. The sites that satisfy these potential defect criteria have the highest probability of defects among all other sites reported in the critical bin.

In step 1714, the location of each critical region that satisfies any of the potential defect criteria in step 1712 is generated as output. An example of an instruction used with commercially available software for reporting a long edge polygon is:

```
SELECT Metal TOUCHING
  S_less_OPCMin {AREA <=
  OPCMinSpace*LongEdge}perm=LongEdgeBin
```

An example of an instruction used with commercially available software for reporting critical regions that share a common point is:

```
SELECT Metal TOUCHING
  {EXTERNAL S_less_OPCMin {POINT_TOUCH=TRUE}}perm=
  TouchBin
```

The result of selecting only those critical regions that satisfy any of the criteria in step 1712 is that a manageable number of locations are reported that may be visually inspected and simulated before manufacturing a mask. The simulation will reveal whether the reported locations are susceptible to failure.

Step 1716 is the exit point for the flow chart 1700.

The flow chart described above with reference to FIG. 17 may also be automated by instructions for a computer. The instructions may be embodied in a disk, a CD-ROM, and other computer readable media according to well known computer programming techniques and may be incorporated into commercially available design rule checker (DRC) software.

In another embodiment, a computer program product includes:

a medium for embodying a computer program for input to a computer; and a computer program embodied in the medium for causing the computer to perform steps of:

(a) receiving as input an optical proximity corrected mask design for an integrated circuit;

(b) searching the corrected mask design to find a critical edge of a polygon that is closer than a selected minimum distance from a polygon edge opposite the critical edge;

(c) constructing a critical region bounded by the critical edge and the polygon edge opposite the critical edge;

(d) comparing the critical region to a potential defect criterion; and (e) generating as output a location of the critical region when the critical region satisfies the potential defect criterion.

Figure 18:
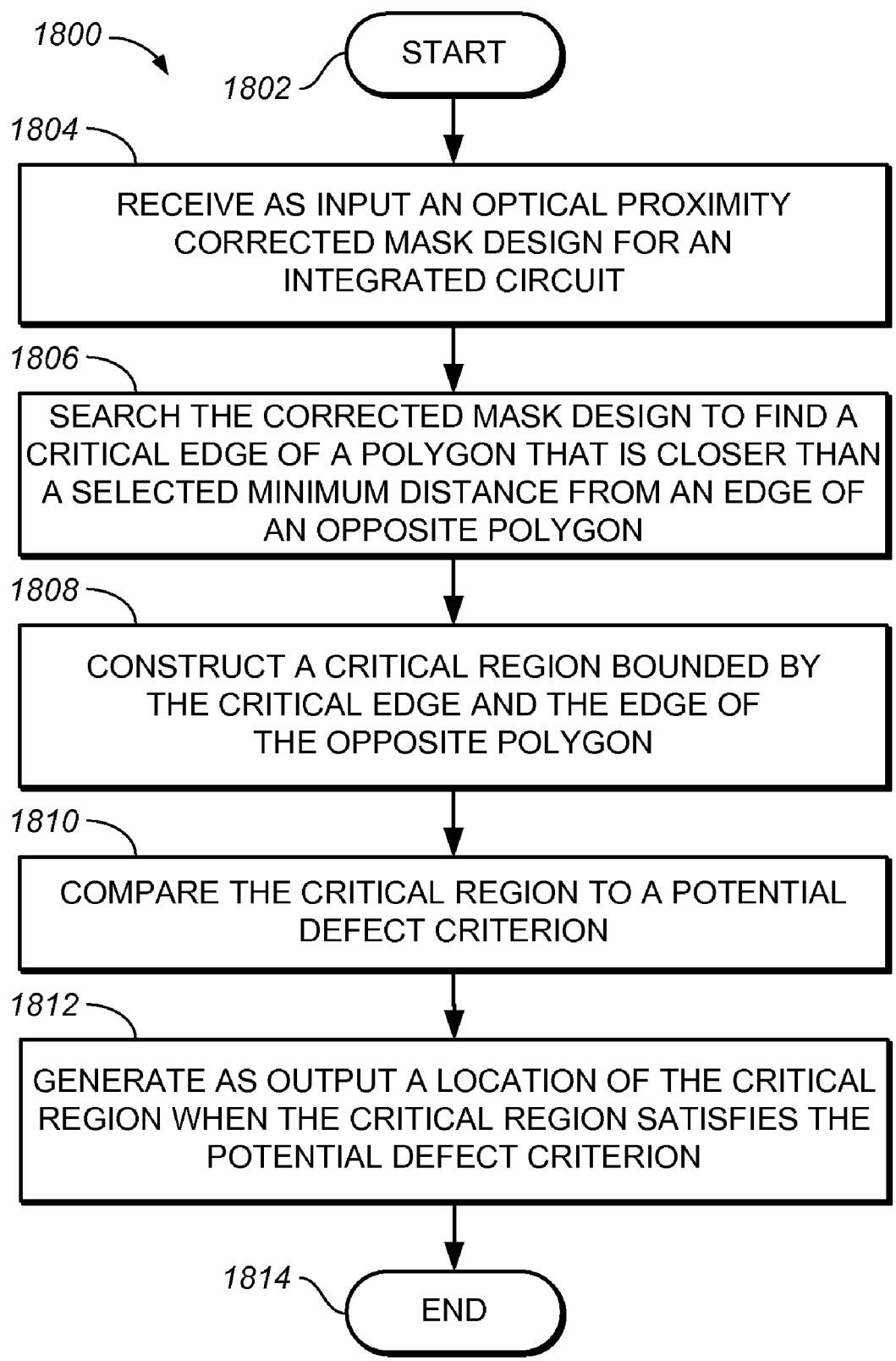
FIG. 18 illustrates a flow chart for a computer program that summarizes the method of FIG. 17.

FIG. 18 illustrates a flow chart 1800 for a computer program that summarizes the method of FIG. 17.

Step 1802 is the entry point of the flow chart 1100.

In step 1804, an optical proximity corrected mask design for an integrated circuit is received as input.

In step 1806, the corrected mask design is searched to find a critical edge of a polygon that is closer than a selected minimum distance from a polygon edge opposite the critical edge.

In step 1808, a critical region bounded by the critical edge and the edge of the opposite polygon is constructed.

In step 1810, the critical region is compared to a potential defect criterion.

In step 1812, a location of the critical region is generated as output when the critical region satisfies the potential defect criterion.

Step 1814 is the exit point of the flow chart 1800.

As may be appreciated from the above, masks for integrated circuit designs may be readily checked after optical proximity correction to detect and locate sites where a bridging defect is likely to occur. In an alternative embodiment, the method described above may be used to find the location of a defect in a manufactured die that fails wafer testing.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method comprising steps of:

(a) receiving as input an optical proximity corrected mask design for an integrated circuit;

(b) searching the corrected mask design to find a critical edge of a polygon that is closer than a selected minimum distance from a polygon edge opposite the critical edge;

(c) constructing a critical region bounded by the critical edge and the polygon edge opposite the critical edge;

(d) comparing the critical region to a potential defect criterion; and (e) generating as output a location of the critical region when the critical region satisfies the potential defect criterion, step (b) comprising selecting the minimum distance within a range from a minimum design rule spacing/width to an optical proximity correction spacing/width.

2. The method of claim 1, step (b) further comprising selecting the minimum distance equal to 1.25 times the minimum optical proximity correction spacing/width.

3. The method of claim 1, step (c) further comprising constructing the critical region as a rectangle.

4. The method of claim 1, step (d) further comprising comparing the critical region to a potential defect criterion comprising a long edge area limit.

5. The method of claim 1, step (d) further comprising comparing the critical region to a potential defect criterion comprising at least one point in the critical region that is shared with another critical region.

6. The method of claim 1, step (d) further comprising comparing the critical region to a potential defect criterion comprising a corner of the critical region within a selected minimum spacing from a corner of another critical region.

7. The method of claim 6 further comprising selecting the minimum spacing substantially equal to 0.1 times a minimum optical proximity correction spacing/width.

8. A computer readable storage medium tangibly embodying instructions for a computer that when executed by the computer implement a method comprising steps of:
(a) receiving as input an optical proximity corrected mask design for an integrated circuit;
(b) searching the corrected mask design to find a critical edge of a polygon that is closer than a selected minimum distance from a polygon edge opposite the critical edge;
(c) constructing a critical region bounded by the critical edge and the polygon edge opposite the critical edge;
(d) comparing the critical region to a potential defect criterion; and
(e) generating as output a location of the critical region when the critical region satisfies the potential defect criterion, step (b) comprising selecting the minimum distance within a range from a minimum design rule spacing/width to an optical proximity correction spacing/width.

9. The computer readable storage medium of claim 8, step (b) further comprising selecting the minimum distance equal to 1.25 times the minimum optical proximity correction spacing/width.

10. The computer readable storage medium of claim 8, step (c) further comprising constructing the critical region as a rectangle.

11. The computer readable storage medium of claim 8, step (d) further comprising comparing the critical region to a potential defect criterion comprising a long edge area limit.

12. The computer program product of claim 8, step (d) comprising comparing the critical region to a potential defect criterion comprising at least one point in the critical region that is shared with another critical region.

13. The computer readable storage medium of claim 8, step (d) further comprising comparing the critical region to a potential defect criterion comprising a corner of the critical region within a selected minimum spacing from a corner of another critical region.

14. The computer readable storage medium of claim 13 further comprising selecting the minimum spacing substantially equal to 0.1 times a minimum optical proximity correction spacing/width.

15. A method comprising steps of:
(a) receiving as input an optical proximity corrected mask design for an integrated circuit;
(b) searching the corrected mask design to find a critical edge of a polygon that is closer than a selected minimum distance from a polygon edge opposite the critical edge;
(c) constructing a critical region bounded by the critical edge and the polygon edge opposite the critical edge;
(d) comparing the critical region to a potential defect criterion; and
(e) generating as output a location of the critical region when the critical region satisfies the potential defect criterion, step (b) comprising selecting the minimum distance within a range from a minimum design rule spacing/width to 1.25 times a minimum optical proximity correction spacing/width.

16. A computer readable storage medium tangibly embodying instructions for a computer that when executed by the computer implement a method comprising steps of:
(a) receiving as input an optical proximity corrected mask design for an integrated circuit;
(b) searching the corrected mask design to find a critical edge of a polygon that is closer than a selected minimum distance from a polygon edge opposite the critical edge;
(c) constructing a critical region bounded by the critical edge and the polygon edge opposite the critical edge;
(d) comparing the critical region to a potential defect criterion; and
(e) generating as output a location of the critical region when the critical region satisfies the potential defect criterion, step (b) further comprising selecting the minimum distance within a range from a minimum design rule spacing/width to 1.25 times a minimum optical proximity correction spacing/width.

* * * * *